United States Patent
Kim

(10) Patent No.: US 7,782,236 B2
(45) Date of Patent: Aug. 24, 2010

(54) CURRENT CELL CIRCUIT IN DIGITAL-ANALOG CONVERTER

(75) Inventor: Sang-June Kim, Gangbuk-gu (KR)

(73) Assignee: Dongbu HiTek Co., Ltd, Seoul (KR)

( * ) Notice: Subject to any disclaimer, the term of this patent is extended or adjusted under 35 U.S.C. 154(b) by 20 days.

(21) Appl. No.: 12/344,499

(22) Filed: Dec. 27, 2008

(65) Prior Publication Data

US 2009/0167424 A1 Jul. 2, 2009

(30) Foreign Application Priority Data

Dec. 27, 2007 (KR) .................. 10-2007-0138896

(51) Int. Cl.
*H03M 1/00* (2006.01)
(52) U.S. Cl. .............. 341/136; 341/135; 341/144; 341/153; 330/253; 330/255; 330/261; 330/296; 327/67; 327/108
(58) Field of Classification Search .......... 341/135, 341/136, 144, 153; 330/253, 255, 261, 296; 327/67, 108
See application file for complete search history.

(56) References Cited

U.S. PATENT DOCUMENTS

| | | | | |
|---|---|---|---|---|
| 5,272,432 A | * | 12/1993 | Nguyen et al. | 323/315 |
| 5,331,322 A | * | 7/1994 | Cha et al. | 341/136 |
| 5,463,394 A | * | 10/1995 | Sun | 341/136 |
| 5,598,095 A | * | 1/1997 | Schnaitter | 323/315 |
| 5,642,078 A | * | 6/1997 | Navabi et al. | 330/253 |
| 6,160,507 A | * | 12/2000 | Carbou et al. | 341/144 |
| 6,340,939 B1 | * | 1/2002 | Dedic | 341/136 |
| 7,227,375 B2 | * | 6/2007 | Groen et al. | 326/27 |
| 7,321,326 B2 | * | 1/2008 | Imai | 341/144 |
| 2002/0044076 A1 | * | 4/2002 | Yao et al. | 341/136 |
| 2007/0279105 A1 | * | 12/2007 | Sunairi | 327/108 |
| 2009/0167579 A1 | * | 7/2009 | Kawano | 341/135 |
| 2009/0201186 A1 | * | 8/2009 | Huang et al. | 341/144 |

* cited by examiner

*Primary Examiner*—Linh V Nguyen
(74) *Attorney, Agent, or Firm*—Sherr & Vaughn, PLLC

(57) ABSTRACT

Embodiments relate to a current cell circuit in a digital-analog converter. According to embodiments, a current cell circuit in a digital-analog converter may include a current source connected to a power voltage terminal to generate current having a predetermined magnitude, a first current switch transferring current provided from the current source to a first output terminal, a first current generator detecting output voltage from the first output terminal and generating the amount of reduced current from the detected voltage, and a first current supplier supplying the amount of current generated from the first current generator to the first current switch. According to embodiments, current variations at a constant output voltage may be minimized. This may make it possible to obtain more stable frequency characteristics.

18 Claims, 4 Drawing Sheets

CURRENT CELL CIRCUIT IN DIGITAL-ANALOG CONVERTER

The present application claims priority under 35 U.S.C. 119 to Korean Patent Application No. 10-2007-0138896 (filed on Dec. 27, 2007), which is hereby incorporated by reference in its entirety.

BACKGROUND

A digital-analog converter (DAC) may convert a digital signal into an analog signal. A DAC may be manufactured using various devices such as a resistor, a capacitor, a current source and the like. A DAC that may be manufactured as described above may have various advantages and disadvantages with respect to conversion speed, resolution, power consumption, and the like according to devices used and structures.

Among digital-analog converters having various structures, a current driving type digital-analog converter may be a suitable structure for high-speed and high-resolution signal conversion. Many digital-analog converters of high-speed and high-resolution apparatuses may be designed as a current driving type DAC.

Recent developments of digital signal processing techniques may include a signal processing method to process parts. According to the related art, analog signals in the related art may be processed with digital signals. Processing results may be converted again into analog signals. An amount of processing data in various wire/wireless communication systems to which such a signal processing method may be applied may be increasing. Hence, an amount of data that may require digital signals to be converted into analog signals may be increasing. Accordingly, there may be an increased demand for a digital-analog converter with improved performance, and with high-speed and high-resolution characteristics, compared to the related art.

In addition, an amount of data processing in various wire/wireless communication systems that may have wide band characteristics and signals that may occupy a wide band may be increasing. Hence, there may be a demand for a digital-analog converter (DAC) having high operation characteristics to process signals occupying a wide band.

Communication systems and high speed image signal processing systems may be developed and implemented as a system on chip (SOC). Therefore, a utility value of a DAC may become more important as intellectual property (IP).

Figure 1:
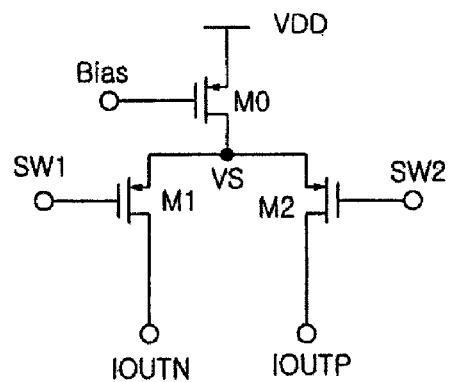

FIG. 1 illustrates a current cell circuit in a related art digital-analog converter. Referring to FIG. 1, a current cell circuit in a DAC may transfer current provided from current source M0 according to signals output from a decoder that may receive N-bit digital data and driver into output terminals IOUTN and IOUTP.

A current cell circuit in a DAC may include first PMOS transistor M0, which may have a source connected to power voltage terminal VDD, and which may operate as a current source to generate current having a predetermined magnitude. A current cell circuit may also include second PMOS transistor M1, which may have a source connected to a drain of first PMOS transistor M1 via node VS, and may operate as a current switch to transfer current provided from first PMOS transistor M1 to first output terminal IOUTN. Third PMOS transistor M2 may also be provided, and may have a source connected to a drain of first PMOS transistor M1 via node VS, and may operate as a current switch to transfer current provided from first PMOS transistor M1 to second output terminal IOUTP.

A gate of second PMOS transistor M1 and a gate of third PMOS transistor M2 may be connected to first switch terminal SW1 and second switch terminal SW2, respectively. If output voltage from first output terminal IOUTN and second output terminal IOUTP is raised, first PMOS transistor M0, which may be a current source, may enter a linear area from a saturation area. In this case, a current value flowing in first PMOS transistor M0 may change when output voltage values from first output terminal IOUTN and second output terminal IOUTP reach a preset voltage value.

If a current value of first PMOS transistor M0 changes, unit current may be mismatched, which may cause differences in output voltage values for input codes. Accordingly, an integral non-linearity (INL) value may have a value more than several least significant bit (LSB) values.

As a digital-analog converter has a wider output range, various systems may be designed more easily. This may increase a demand for a wider IP output range of a digital-analog converter. However, as shown in FIG. 1, in a related art current cell circuit, differences in output voltage for input codes may occur. This may reduce an amount of current from a current source.

SUMMARY

Embodiments relate to a digital-analog converter (DAC). Embodiments relate to a current cell circuit in a digital-analog converter and a method of providing current from a current cell circuit in a digital-analog converter.

Embodiments relate to a current cell circuit in a digital-analog converter that may widen a range of output voltage by converting voltage detected from a current cell circuit into current. This may compensate for an amount of current reduced as output voltage increases, so that current variations may be minimized at a predetermined output voltage.

According to embodiments, a current cell circuit in a digital-analog converter may include at least one of the following. A current source connected to a power voltage terminal to generate current having a predetermined magnitude. A first current switch transferring current provided from the current source to a first output terminal. A first current generator to detect output voltage from the first output terminal and generate the amount of reduced current from the detected voltage. A first current supplier to supply the amount of current generated from the first current generator to the first current switch.

DRAWINGS

FIG. 1 is a drawing illustrating a current cell circuit in a related art digital-analog converter (DAC).

Figure 2:
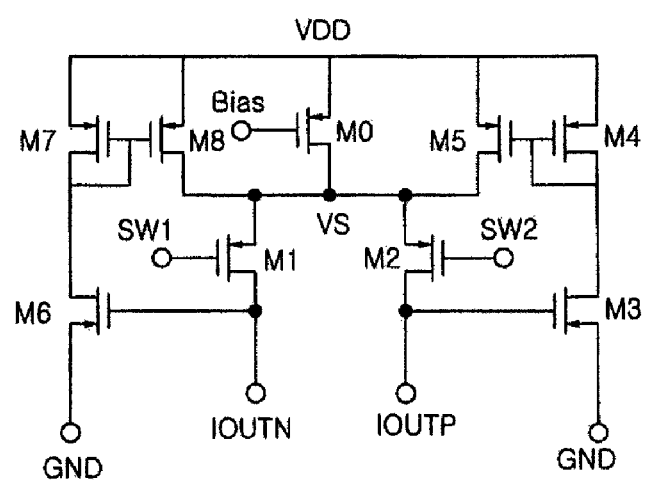

Example FIG. 2 is a circuit view of a current cell circuit in a digital-analog converter according to embodiments.

Figure 3:
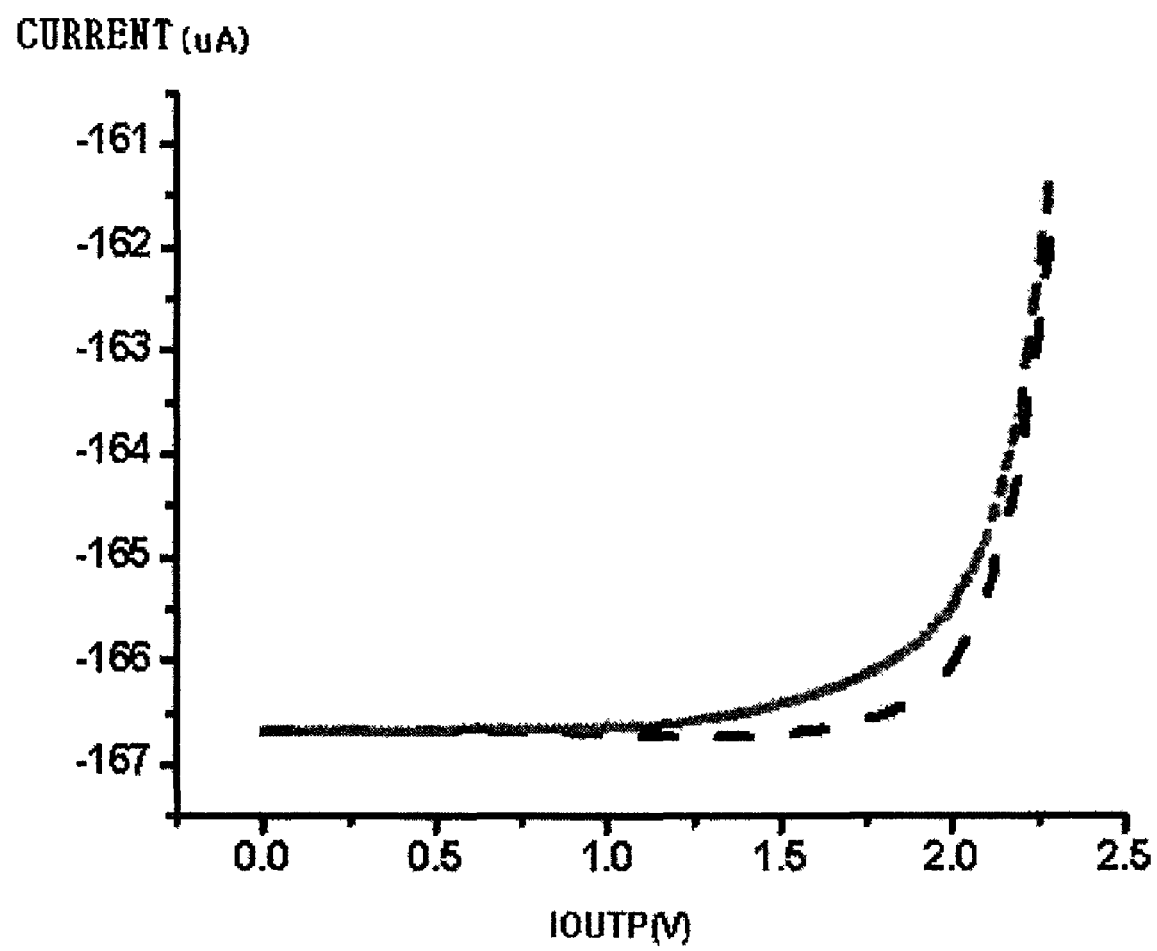

Example FIG. 3 is a graph comparing characteristics of a current cell circuit according to embodiments with characteristics of a related art current cell circuit.

Figure 4:
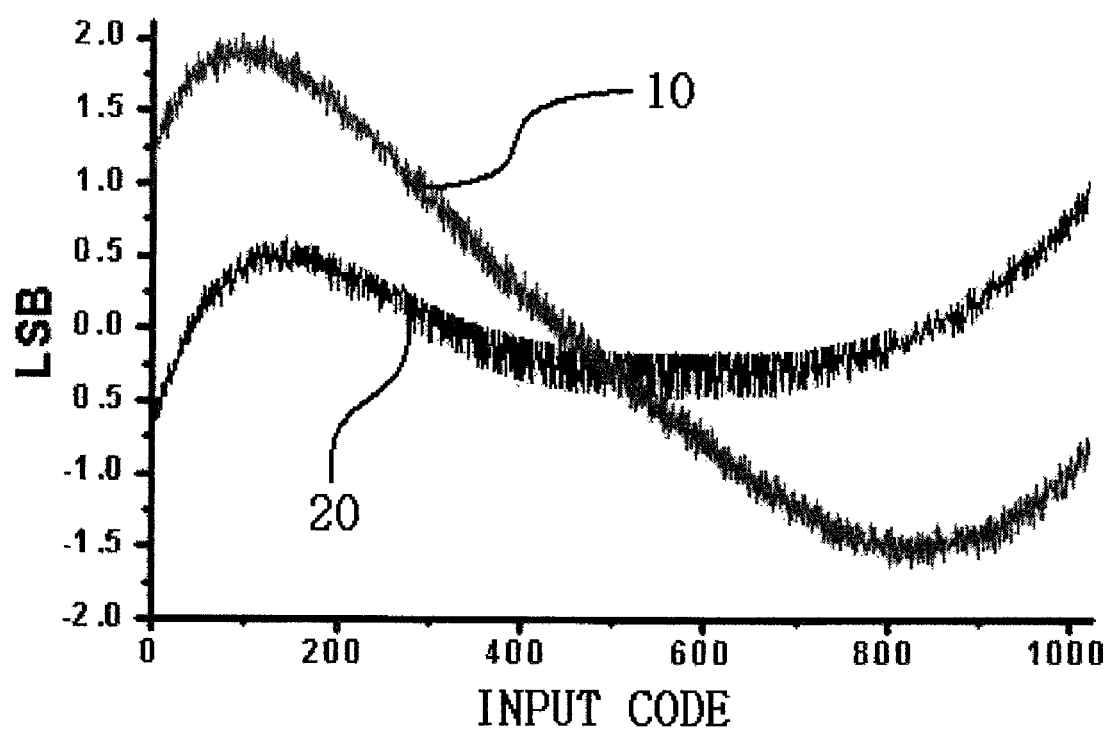
Figure 5:
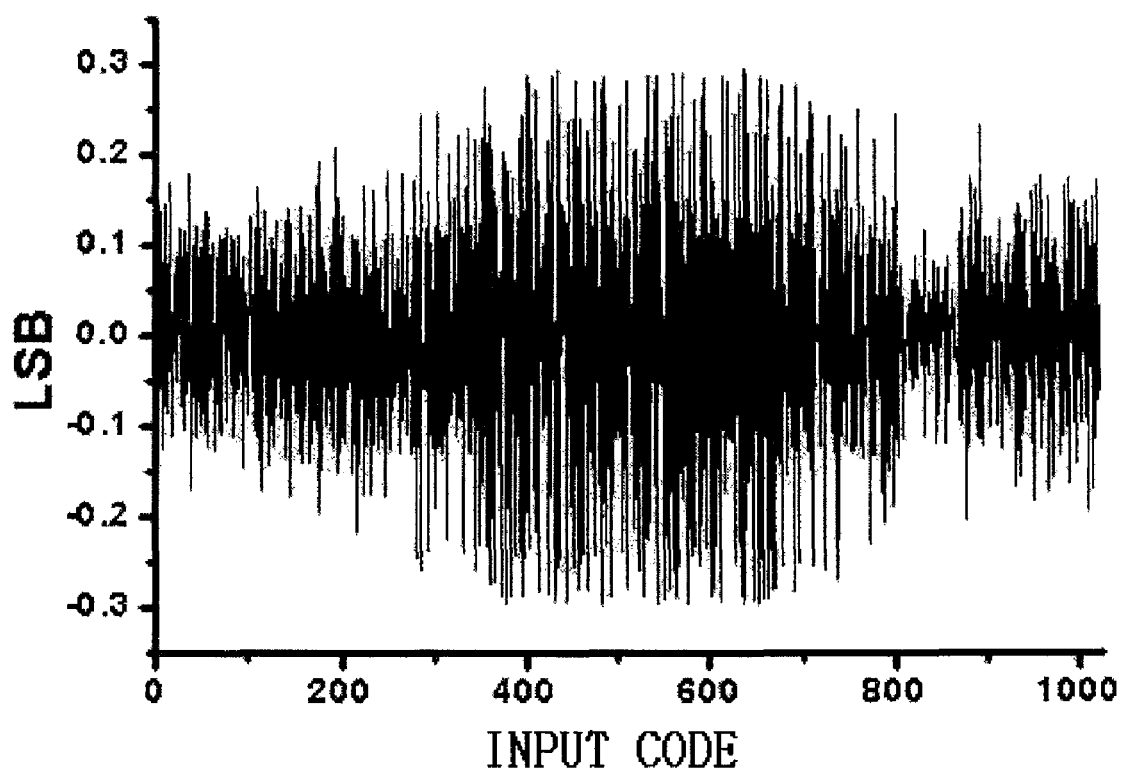

Example FIGS. 4 and 5 are graphs showing performance measurement results of a digital-analog converter using a current cell circuit, according to embodiments.

DESCRIPTION

Example FIG. 2 is a circuit view of a current cell circuit in a digital-analog converter according to embodiments. Referring to example FIG. 2, a current cell circuit in a digital-analog converter (DAC) may transfer current provided from current source M0 in accordance with signals output from driver and a decoder that may receive N-bit digital data to output terminals IOUTN and IOUTP.

According to embodiments, a current cell circuit in a DAC may also include four PMOS transistors M4, M5, M7 and M8 and two NMOS transistors M3 and M6. A current cell circuit may also include first PMOS transistor M0, second PMOS transistor M1, and third PMOS transistor M2.

According to embodiments, first PMOS transistor M0, which may have a source connected to power voltage terminal VDD, may operate as a current source to generate current having a predetermined magnitude. According to embodiments, second PMOS transistor M1 may have a source connected to receive current provided from first PMOS transistor M0 and a drain connected to first output terminal IOUTN. According to embodiments, second PMOS transistor M1, whose source may be connected to a drain of first PMOS transistor M0 through node VS, may operate as a current switch, and may transfer current provided from first PMOS transistor M0 to first output terminal IOUTN.

According to embodiments, third PMOS transistor M2 may have a source connected to receive current provided from first PMOS transistor M0 and a drain connected to second output terminal IOUTP. According to embodiments, third PMOS transistor M2, whose source may be connected to a drain of first PMOS transistor M0 through node VS, may operate as a current switch, and may transfer a current provided from first PMOS transistor M0 to second output terminal IOUTP.

According to embodiments, first NMOS transistor M3 may have a gate connected to a drain of third PMOS transistor M2 and second output terminal IOUPT in parallel, and a source connected to ground terminal GND. According to embodiments, first NMOS transistor M3 may detect output voltage from second output terminal IOUTP and may generate an amount of reduced current from the detected voltage. According to embodiments, first NMOS transistor M3 may operate as a current generator.

According to embodiments, fourth PMOS transistor M4 may have a source connected to power voltage terminal VDD, and a drain and a gate connected to a drain of first NMOS transistor M3. Fifth PMOS transistor M5 may have a source connected to power voltage terminal VDD, a gate connected to a gate of fourth PMOS transistor M4, and a drain connected to node VS.

According to embodiments, fourth PMOS transistor M4 and fifth PMOS transistor M5 may supply an amount of current generated from first NMOS transistor M3 to third PMOS transistor M2. According to embodiments, fourth PMOS transistor M4 and fifth PMOS transistor M5 may be current generators.

According to embodiments, second NMOS transistor M6 may have a gate connected to a drain of second PMOS transistor M1 and first output terminal IOUPN in parallel, and a source connected to a ground terminal GND. Second NMOS transistor M6 may detect output voltage from first output terminal IOUTN and may generate an amount of reduced current from a detected voltage. According to embodiments, second NMOS transistor M6 may operate as a current generator.

According to embodiments, sixth PMOS transistor M7 may have a source connected to power voltage terminal VDD, and a drain and a gate connected to a drain of second NMOS transistor M6. According to embodiments, seventh PMOS transistor M8 may have a source connected to power voltage terminal VDD, a gate connected to a gate of sixth PMOS transistor M7, and a drain connected to node VS.

According to embodiments, sixth PMOS transistor M7 and seventh PMOS transistor M8 may supply an amount of current generated from second NMOS transistor M6 to second PMOS transistor M1. According to embodiments, sixth PMOS transistor M7 and seventh PMOS transistor M8 may be current generators.

According to embodiments, as output voltage of output terminals IOUTN and IOUTP rise, voltage of node VS may also rise. Owing to such a phenomenon, a voltage difference between a source and drain of first PMOS transistor M0, which may be a current source, may decrease. According to embodiments, an amount of unit current generated from first PMOS transistor M0 may decrease.

According to embodiments, in a current cell circuit in a digital-analog converter an output voltage from output terminals IOUTN and IOUTP may be detected, respectively, through first NMOS transistor M3 and second NMOS transistor M6. An amount of reduced current from a detected voltage may be generated. An amount of current generated from first NMOS transistor M3 may be supplied to third PMOS transistor M2 through fourth PMOS transistor M4 and fifth PMOS transistor M5. An amount of current generated from second NMOS transistor M6 may be supplied to second PMOS transistor M1 through sixth PMOS transistor M7 and seventh PMOS transistor M8.

Example FIG. 3 is a graph comparing characteristics of a current cell circuit, according to embodiments, with characteristics of a related art current cell circuit. A horizontal axis may represent voltage of an output terminal and a vertical axis may represent current of a third PMOS transistor M2. A solid line may represent a related art technique and a dotted line may represent embodiments.

Referring to example FIG. 3, if voltage IOUTP from an output terminal reaches 1.6V, a related art current cell circuit may have large current variations. A current cell according to embodiments may have a substantially constant output current, even though a voltage IOUTP from an output terminal reaches 1.6V.

Example FIGS. 4 and 5 are graphs showing performance measurement results of a digital-analog converter using a current cell circuit according to embodiments. In the graphs shown in example FIGS. 4 and 5, a horizontal axis may represent an input code and a vertical axis may represent LSB, respectively. In example FIG. 4, reference numeral 10 may represent a performance of a related art digital-analog converter, and reference numeral 20 may represent a performance of a digital-analog converter using a current cell circuit according to embodiments. Example FIG. 5 shows only performance measurement results of a digital-analog converter using a current cell circuit according to embodiments.

Referring to example FIG. 4, integral non-linearity (INL) characteristics of a current cell circuit in a digital-analog converter according to embodiments may be improved more than doubled as compared to a related art current cell circuit. Differential Non-Linearity (DNL) characteristics of a current cell circuit in a digital-analog converter according to embodiments may be substantially the same as compared to a related art current cell circuit, as shown in example FIG. 5.

Table 1 exemplifies simulation results for a current cell circuit in a digital-analog converter according to embodiments.

TABLE 1

| | |
|---|---|
| INL | +/−1 LSB |
| DNL | +/−0.3 LSB |

TABLE 1-continued

| | |
|---|---|
| SNR (at, fin = 2.34M, fs = 100M) | 53.02 dB |
| SFDR (at, fin = 2.34M, fs = 100M) | 53.88 dB |
| Output Swing | −1.6~1.6 V |
| Resolution | 10 bit |
| VDD | 3.3 V |

According to embodiments, SFDR may represent a spurious-free dynamic range and SNR may represent a signal to noise ratio. According to embodiments, a current cell circuit in the digital-analog converter may be applied, for example, to a digital-analog converter with a 10 bit 100 Msps and a 0.13 μm spice model is used as an application device.

Referring to Table 1, through simulation results, a current cell circuit may have power voltage VDD of 3.3V, and may have a wide swing structure with output voltage ranging from approximately −1.6V to 1.6V, INL of +/−1 LSB, and DNL of +/−0.3 LSB.

Also, if an input frequency fin is 2.3 MHz and a sampling frequency fs is 100 MHz, a spurious-free dynamic range (SFDR) may be approximately 53.88 dB and a signal to noise ratio (SNR) may be approximately 53.07 dB.

According to embodiments, if a current cell circuit in a digital-analog converter is used, L values (length of first PMOS transistor M0 in example FIG. 2) of a current source within a current cell may be increased, which may result in better frequency characteristics.

A current cell circuit in a digital-analog converter according to embodiments may minimize current variations at a constant output voltage. This may provide more stable frequency characteristics.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
    a current source connected to a power voltage terminal and configured to generate a current having a predetermined magnitude;
    a first current switch configured to transfer the current provided from the current source to a first output terminal;
    a first current generator configured to detect an output voltage from the first output terminal and generate a first amount of reduced current from the detected voltage; and
    a first current supplier configured to supply the first amount of current generated from the first current generator to the first current switch,
    wherein the first current generator comprises an NMOS transistor having a gate connected to the first output terminal, a source connected to a ground terminal, and a drain connected to the first current supplier.

2. The device of claim 1, wherein the first current supplier comprises:
    a first PMOS transistor having a source connected to the power voltage terminal, a drain and gate connected to the drain of the NMOS transistor; and
    a second PMOS transistor having a source connected to the power voltage terminal, a gate connected to the gate of the first PMOS transistor, and a drain connected to the first current switch.

3. A device comprising:
    a current source connected to a power voltage terminal and configured to generate a current having a predetermined magnitude;
    a first current switch configured to transfer the current provided from the current source to a first output terminal;
    a first current generator configured to detect an output voltage from the first output terminal and generate a first amount of reduced current from the detected voltage;
    a first current supplier configured to supply the first amount of current generated from the first current generator to the first current switch;
    a second current switch configured to transfer the current provided from the current source to a second output terminal;
    a second current generator configured to detect an output voltage from the second output terminal and generate a second amount of reduced current from the detected voltage; and
    a second current supplier configured to supply the second amount of current generated from the second current generator to the second current switch.

4. The device of claim 3, wherein the current source comprises a PMOS transistor having a source connected to the power voltage terminal and a drain connected to the first and second current switches in parallel.

5. The device of claim 3, wherein the second current switch comprises a PMOS transistor having a source connected to receive the current provided from the current source and a drain connected to the second output terminal.

6. The device of claim 3, wherein the second current generator comprises an NMOS transistor having a gate connected to the second output terminal, a source connected to a ground terminal, and a drain connected to the second current supplier.

7. The device of claim 6, wherein the second current supplier comprises:
    a first PMOS transistor having a source connected to the power voltage terminal, a drain and gate connected to the drain of the NMOS transistor; and
    a second PMOS transistor having a source connected to the power voltage terminal, a gate connected to the gate of the first PMOS transistor, and a drain connected to the second current switch.

8. The device of claim 3, wherein the first current generator comprises a first NMOS transistor having a gate connected to the first output terminal, a source connected to a ground terminal, and a drain connected to the first current supplier, and wherein the second current generator comprises a second NMOS transistor having a gate connected to the second output terminal, a source connected to the ground terminal, and a drain connected to the second current supplier.

9. The device of claim 8, wherein the first current supplier comprises:
    a first PMOS transistor having a source connected to the power voltage terminal, and a drain and gate connected to the drain of the first NMOS transistor; and
    a second PMOS transistor having a source connected to the power voltage terminal, a gate connected to the gate of the first PMOS transistor, and a drain connected to the first current switch.

10. The device of claim 9, wherein the second current supplier comprises:
    a third PMOS transistor having a source connected to the power voltage terminal, a drain and gate connected to the drain of the second NMOS transistor; and a fourth PMOS transistor having a source connected to the power voltage terminal, a gate connected to the gate of the third PMOS transistor, and a drain connected to the second current switch.

11. The device of claim 1, wherein the current source comprises a PMOS transistor having a source connected to the power voltage terminal and a drain connected to the first current switch.

12. The device of claim 1, wherein the first current switch comprises a PMOS transistor having a source connected to the current provided from the current source and a drain connected to the first output terminal.

13. A method, comprising:
generating a current having a predetermined magnitude using a current source connected to a power voltage terminal;
transferring the current provided from the current source to a first output terminal using a first current switch;
detecting an output voltage from the first output terminal and generating a first amount of reduced current from the detected voltage using a first current generator;
supplying the first amount of current generated from the first current generator to the first current switch using a first current supplier;
transferring current provided from the current source to a second output terminal using a second current switch;
detecting an output voltage from the second output terminal and generating a second amount of reduced current from the detected voltage using a second current generator; and
supplying the second amount of current generated from the second current generator to the second current switch using a second current supplier.

14. The method of claim 13, wherein the first current generator comprises an NMOS transistor having a gate connected to the first output terminal, a source connected to a ground terminal, and a drain connected to the first current supplier.

15. The method of claim 14, wherein the first current supplier comprises:
a first PMOS transistor having a source connected to the power voltage terminal, a drain and gate connected to the drain of the NMOS transistor; and
a second PMOS transistor having a source connected to the power voltage terminal, a gate connected to the gate of the first PMOS transistor, and a drain connected to the first current switch.

16. The method of claim 13, wherein the current source comprises a first PMOS transistor having a source connected to the power voltage terminal and a drain connected to the first and second current switches in parallel, and wherein the second current switch comprises a second PMOS transistor having a source connected to current provided from the current source and a drain connected to the second output terminal.

17. The method of claim 13, wherein the second current generator comprises an NMOS transistor having a gate connected to the second output terminal, a source connected to a ground terminal, and a drain connected to the second current supplier.

18. The method of claim 17, wherein the second current supplier comprises:
a first PMOS transistor having a source connected to the power voltage terminal, a drain and gate connected to the drain of the NMOS transistor; and
a second PMOS transistor having a source connected to the power voltage terminal, a gate connected to the gate of the first PMOS transistor, and a drain connected to the second current switch.

* * * * *